(12) United States Patent
Fujii et al.

(10) Patent No.: US 12,020,967 B2
(45) Date of Patent: Jun. 25, 2024

(54) SUBSTRATE LIFTING APPARATUS AND SUBSTRATE TRANSFERRING METHOD

(71) Applicant: ULVAC TECHNO, LTD., Kanagawa (JP)

(72) Inventors: Katsunori Fujii, Kanagawa (JP); Masanori Ito, Kanagawa (JP)

(73) Assignee: ULVAC TECHNO, LTD., Kanagawa (JP)

( * ) Notice: Subject to any disclaimer, the term of this patent is extended or adjusted under 35 U.S.C. 154(b) by 939 days.

(21) Appl. No.: 16/981,068

(22) PCT Filed: May 8, 2019

(86) PCT No.: PCT/JP2019/018355
§ 371 (c)(1),
(2) Date: Sep. 30, 2020

(87) PCT Pub. No.: WO2020/026549
PCT Pub. Date: Feb. 6, 2020

(65) Prior Publication Data
US 2023/0163010 A1    May 25, 2023

(30) Foreign Application Priority Data
Jul. 30, 2018  (JP) .................................. 2018-142815

(51) Int. Cl.
| | | |
|---|---|---|
| H01L 21/677 | (2006.01) | |
| H01L 21/687 | (2006.01) | |
| H01L 21/683 | (2006.01) | |

(52) U.S. Cl.
CPC .. *H01L 21/67751* (2013.01); *H01L 21/68742* (2013.01); *H01L 21/6831* (2013.01)

(58) Field of Classification Search
CPC .................... H01L 21/67751; H01L 21/68742
See application file for complete search history.

(56) References Cited

U.S. PATENT DOCUMENTS

| | | | |
|---|---|---|---|
| 5,956,837 A | 9/1999 | Shiota et al. | |
| 8,363,378 B2 * | 1/2013 | Bluck | H01L 21/68742 |
| | | | 361/234 |

(Continued)

FOREIGN PATENT DOCUMENTS

| | | | | |
|---|---|---|---|---|
| CN | 1877806 A | * | 12/2006 | ........... G02F 1/1303 |
| JP | 10-150099 A | | 6/1998 | |

(Continued)

OTHER PUBLICATIONS

International Search Report for PCT Patent App. No. PCT/JP2019/018355 (Jun. 25, 2019).

*Primary Examiner* — Eric A. Gates
(74) *Attorney, Agent, or Firm* — Future IP LLC; Tomoko Nakajima

(57) ABSTRACT

A substrate lifting apparatus LM according to this invention is built into a stage ST having, on an upper surface, an electrostatic chuck EC for attracting a to-be-processed substrate W hands over the to-be-processed substrate to and from the stage has: lifting pins which are moveable upward and downward between a hidden position in which the lifting pins lie hidden into the stage, and a protruded position protruding upward from the upper surface of the stage; and a driving means for moving the lifting pins upward and downward. The driving means is arranged to be able to stop the upward movement of the lifting pins in an intermediate position in the course of moving the lifting pins upward from the hidden position to the protruded position.

4 Claims, 2 Drawing Sheets

(56) References Cited

U.S. PATENT DOCUMENTS

| | | | |
|---|---|---|---|
| 8,652,260 B2* | 2/2014 | Yu | H01L 21/68728 |
| | | | 156/345.52 |
| 2005/0045618 A1* | 3/2005 | Ito | C04B 35/62655 |
| | | | 219/548 |
| 2010/0142113 A1 | 6/2010 | Lee et al. | |
| 2010/0214712 A1 | 8/2010 | Yamawaku et al. | |
| 2011/0058302 A1* | 3/2011 | Valcore, Jr. | H01L 21/67069 |
| | | | 361/234 |

FOREIGN PATENT DOCUMENTS

| | | | |
|---|---|---|---|
| JP | 11-243137 A | | 9/1999 |
| JP | 2006-303138 A | | 11/2006 |
| JP | 2008-041969 A | | 2/2008 |
| JP | 2010-199239 A | | 9/2010 |
| JP | 2012-511831 A | | 5/2012 |
| JP | 2016-092186 A | | 5/2016 |
| KR | 20090084778 A | * | 8/2009 |
| KR | 20110128895 A | * | 11/2011 |
| KR | 20170024215 A | * | 3/2017 |
| TW | 1543285 B | * | 7/2016 |

\* cited by examiner

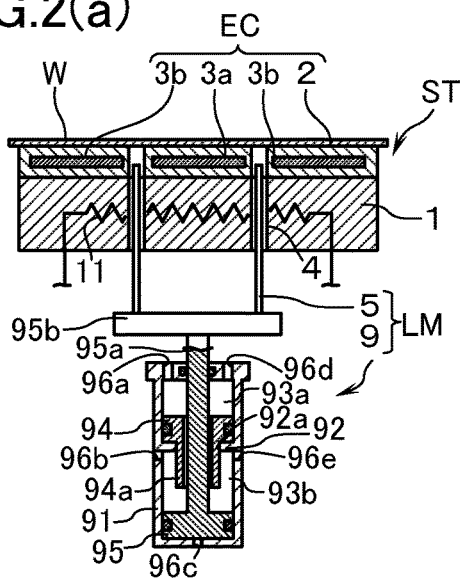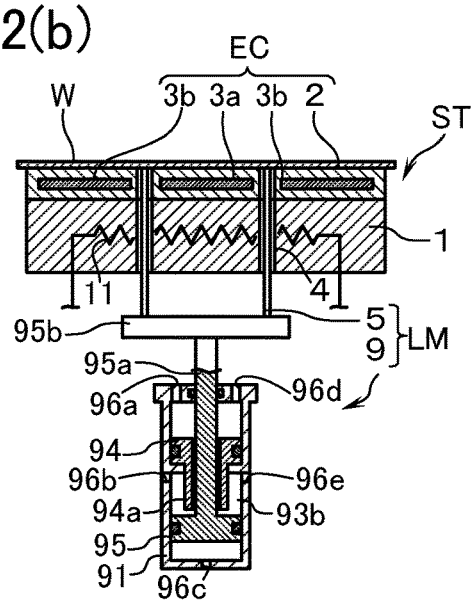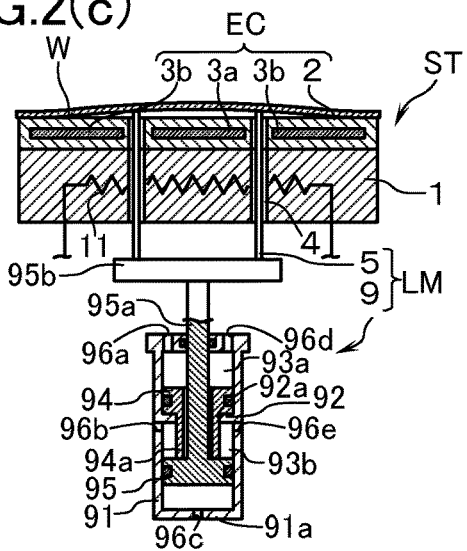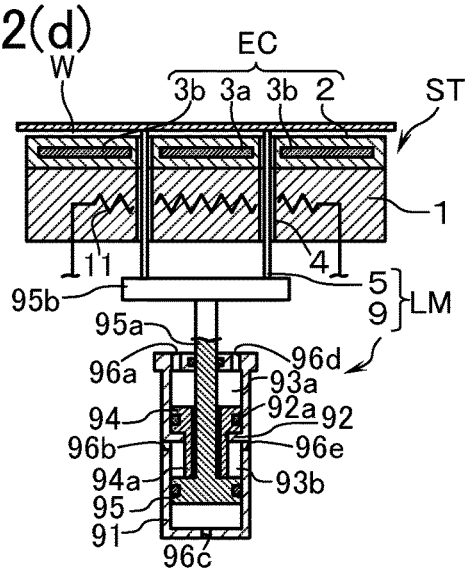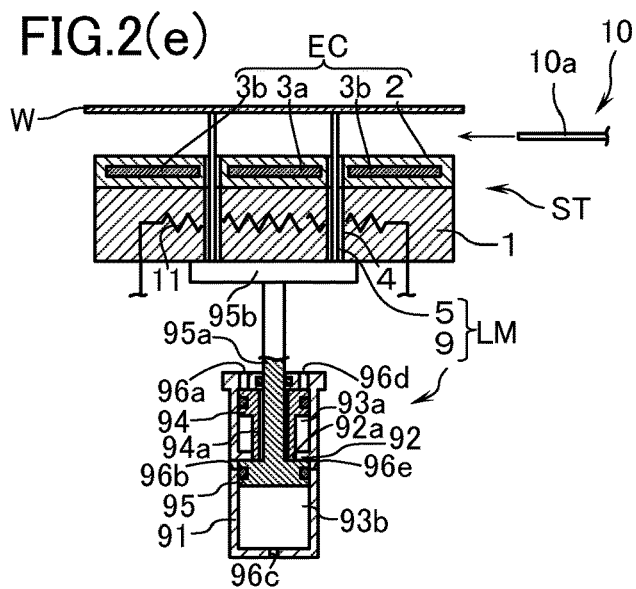

SUBSTRATE LIFTING APPARATUS AND SUBSTRATE TRANSFERRING METHOD

This application is a national phase entry under 35 U.S.C. § 371 of PCT Patent Application No. PCT/JP2019/018355, filed on May 8, 2019, which claims priority under 35 U.S.C. § 119 to Japanese Patent Application No. 2018-142815, filed Jul. 30, 2018, both of which are incorporated by reference.

TECHNICAL FIELD

The present invention relates to a substrate lifting apparatus and a substrate transferring method, the apparatus being adapted to be built into a stage having an electrostatic chuck for attracting, to an upper surface of the electrostatic chuck, a substrate to be processed (hereinafter called "a to-be-processed substrate") so as to hand over the to-be-processed substrate to and from the stage.

BACKGROUND ART

In the steps of manufacturing semiconductors, in order to obtain desired device structures, various kinds of processing are performed, on a to-be-processed substrate such as a silicon wafer, a glass substrate, and the like, the processing being such as film-forming processing by a sputtering method, a plasma CVD method, and the like, a thermal processing, an ion-injection processing, an etching processing, and the like. The processing apparatus for performing these kinds of processing is generally provided with a stage having an electrostatic chuck for holding in position, inside a vacuum chamber in vacuum atmosphere, the to-be-processed substrate.

The electrostatic chuck has a ceramic plate (chuck plate) which is made, e.g., of Pyrolytic Boron Nitride (PNB) and which is mounted on the surface of the metallic stage. This chuck plate has buried therein a pair of electrodes (so-called bipolar type). Across the pair of electrodes DC voltage (chuck voltage) is applied by a power supply apparatus. According to this arrangement, by means of the electrostatic force generated by applying the DC voltage to both the electrodes, the to-be-processed substrate will be attracted to, and held on, the surface of the chuck plate (chuck operation). Then, in order to hand over the to-be-processed substrate to and from the above-mentioned stage, there is disposed the above-mentioned substrate lifting apparatus (see, e.g., Patent Document 1).

The substrate lifting apparatus is provided with: lifting pins which are moveable upward and downward between a hidden position in which the lifting pins lie hidden into the stage, and a substrate hand over position in which the lifting pins are protruded upward beyond the upper surface of the stage so as to lift the to-be-processed substrate above a predetermined height of the upper surface of the stage; and a drive means which moves the lifting pins upward and downward. In handing over the to-be-processed substrate to the stage, in a state in which the lifting pins are moved upward into the substrate hand over position, handing over is performed such that the to-be-processed substrate is supported by the transfer robot at the upper ends of the lifting pins. Then, when the lifting pins are moved downward to the hidden position, the to-be-processed substrate will be placed on the substrate hand over position (i.e., chuck plate). In this state, DC voltage is applied to the electrodes of the electrostatic chuck to attract the to-be-processed substrate, thereby performing various processing. Once the processing has been finished, electric voltage charging to the electrodes of the electrostatic chuck will be stopped (attraction stopping operation). Then, after moving the lifting pins to the substrate hand over position, thereby lifting the to-be-processed substrate, the to-be-processed substrate is handed over, e.g., to the transfer robot.

By the way, in case a predetermined processing utilizing plasma is performed on the to-be-processed substrate, even if the attraction stopping operation is performed, there will be cases in which the to-be-processed substrate remains attracted to the surface of the chuck plate due to the electric charges that remain in the to-be-processed substrate. Therefore, prior to lifting of the to-be-processed substrate by the lifting pins up to the substrate hand over position, it is generally known to perform charge clearing operation (i.e., operation to clear the electrostatic charge) to the to-be-processed substrate (see, e.g., Patent Document 2).

If, in a state in which the charge clearing of the to-be-processed substrate is insufficient, the lifting pins are moved upward to thereby lift the to-be-processed substrate, there will be disadvantages in that positional deviation or rebounding of the to-be-processed substrate may happen and, in some particular cases, there will happen cracking or chipping to the to-be-processed substrate. On the other hand, it is considered to dispose various kinds of devices to see whether the to-be-processed substrate has been charge-cleared or not and, subject to the complete charge clearing thereof, to move the lifting pins upward. This solution, however, incurs not only an increase in the number of parts with the resultant increase in cost but also time in handing over of the to-be-processed substrate, resulting in a decrease in throughput.

PRIOR ART DOCUMENTS

Patent Documents

Patent Document 1: JP2016-92186 A
Patent Document 2: JP2010-199239 A

SUMMARY OF THE INVENTION

Problems that the Invention is to Solve

In view of the above points, this invention has a problem of providing a substrate lifting apparatus and a substrate transferring method in which, without waiting for the complete charge clearing of the to-be-processed substrate and without the possibility of positional deviation or rebounding of the to-be-processed substrate, the to-be-processed substrate that has been processed can be moved to the substrate hand over position.

Means for Solving the Problems

In order to solve the above-mentioned problems, this invention is a substrate lifting apparatus which is built into a stage having an electrostatic chuck disposed on an upper surface of the stage for attracting a to-be-processed substrate. The substrate lifting apparatus hands over the to-be-processed substrate to and from the stage. The substrate lifting apparatus comprises: lifting pins movable upward and downward between a hidden position in which the lifting pins lie hidden into the stage and a protruded position in which the lifting pins protrude upward from the upper surface of the stage; and a driving means for moving the lifting pins upward and downward. The driving means is constituted such that, in a course of moving the lifting pins upward from the hidden position to the protruded position, the upward movement of the lifting pins can be stopped in an intermediate position in which a part of the to-be-processed substrate is locally lifted (or caused to be floated).

According to this invention, in case a predetermined processing using plasma has been finished on the to-be-processed substrate and then the processed substrate is taken out, first, the operation of stopping the attraction of the to-be-processed substrate is performed and, at the same time, charge clearing operation is performed on the to-be-processed substrate by the known method. Then, without waiting for the to-be-processed substrate to be completely charge-cleared (e.g., by judging based on the lapse of time from the starting of the charge clearing operation), the lifting pins are moved upward from the hidden position to the intermediate position. Then, that part (e.g., the central part) of the to-be-processed substrate on which the pressing force from the lifting pins operates will be partially lifted up against the attraction force by the residual electric charge (in this case, the remaining part of the to-be-processed substrate will remain fixed to the electrostatic chuck by means of the residual electric charge).

Then, when the lifting pins are held in the intermediate position for a predetermined period of time, the remaining part of the to-be-processed substrate will gradually be peeled off, by the restoring force thereof, from the electrostatic chuck outward, with that part of the to-be-processed substrate on which the pressing force from the lifting pins operate serving as an origin, finally resulting in a complete peeling off of the to-be-processed substrate from the electrostatic chuck. In this case, unlike the case with the above-mentioned conventional example in which the to-be-processed substrate is peeled off by force as a result of causing the pushing force from the lifting pins, there will occur no disadvantages such as positional deviation or rebounding of the to-be-processed substrate.

As described above, according to this invention, since an arrangement has been employed in which the upward movement of the lifting pins can be stopped by the driving means in an intermediate position, it becomes possible to transfer the to-be-processed substrate that has been processed to the substrate hand over position without giving rise to the positional deviation or rebounding of the to-be-processed substrate, and also without waiting for the complete charge clearing of the to-be-processed substrate.

In the invention relating to the substrate lifting apparatus, suppose that the to-be-processed substrate is a silicon wafer that is generally used in the manufacturing, etc. of semiconductor devices. If, in the intermediate position, the said part of the silicon wafer is locally lifted above the upper surface of the stage by a height above $1/500$ and below $1/200$ of the substrate diameter, confirmation has been made that it becomes possible to transfer the to-be-processed substrate that has been processed to the substrate hand over position without giving rise to the positional deviation or rebounding of the to-be-processed substrate, and without waiting for the complete charge clearing of the to-be-processed substrate.

In addition, in order to solve the above-mentioned problems, the substrate transferring method of this invention comprises: a stopping step of stopping the application of voltage to the electrostatic chuck, after having processed a to-be-processed substrate in a state of being attracted by applying voltage to electrodes of the electrostatic chuck disposed on an upper surface of a stage; and a lifting step of moving upward the lifting pins, built in the stage so as to be movable upward and downward to a substrate hand over position by lifting the to-be-processed substrate to the substrate hand over position above the stage. The lifting step comprises: a first step of moving upward the lifting pins from a hidden position lying hidden into the stage until the upper ends of the lifting pins are brought into contact with a central part of the to-be-processed substrate, the lifting pins being further moved upward from the position of the contact, thereby causing such a part of the to-be-processed substrate as is lying on the electrostatic chuck to be locally lifted; a second step of holding, for a predetermined period of time, the lifting pins in an intermediate position in which the said part of the to-be-processed substrate is lifted; and a third step of further moving upward the lifting pins from the intermediate position to the substrate hand over position.

In the invention relating to the substrate transferring method, in case the to-be-processed substrate is a silicon wafer, in the first step, the height of causing the said part of silicon wafer to be locally lifted from upper surface of the stage shall preferably be set above $1/500$ and below $1/200$ of the substrate diameter. Further, in the above-mentioned second step, the lifting pins shall preferably be held for above 4 seconds in the intermediate position in which the said part of the to-be-processed substrate is lifted.

BRIEF DESCRIPTION OF THE DRAWINGS

FIG. 2(a) through FIG. 2(e) are sectional views showing a series of movements when the to-be-processed substrate that has been processed by the substrate lifting apparatus as shown in FIG. 1, is being handed over by the substrate lifting apparatus, in which FIG. 2(a) shows a hidden position, FIG. 2(b) shows a contact position, FIG. 2(c) shows an intermediate position, FIG. 2(d) shows a state of the to-be-processed substrate when it has been held in the intermediate position for a predetermined period of time, and FIG. 2(e) shows a substrate hand over position.

MODES FOR CARRYING OUT THE INVENTION

Figure 1:
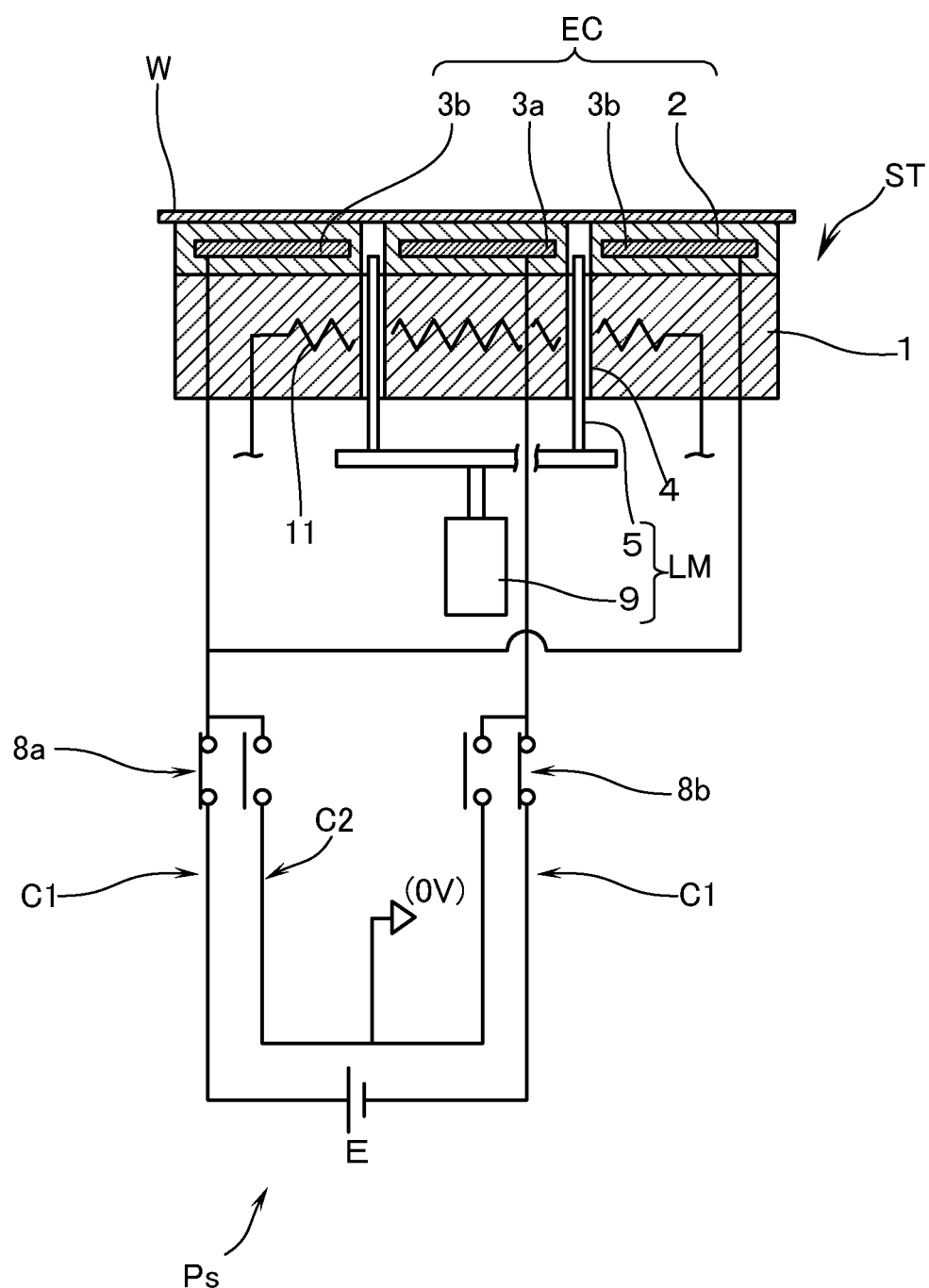
FIG. 1 is a schematic sectional view of a stage in which the substrate lifting apparatus relating to an embodiment of this invention is assembled.

With reference to the drawings, a description will now be made of an embodiment: in which provided that a to-be-processed substrate is defined to be a silicon wafer (hereinafter referred to as a "wafer W") of a size (e.g., Φ150 mm through Φ450 mm, i.e., within a range of Φ150 mm and Φ450 mm in diameter) which is generally used in manufacturing and the like of semiconductor devices; and provided that the electrostatic chuck is defined to be of a bipolar type. A substrate lifting apparatus is assembled onto a stage having on its upper surface an electrostatic chuck for attracting the wafer W thereto. The substrate lifting apparatus for handing over the wafer W to and from the stage as well as a substrate transferring method will be described. In the following, on the basis of the posture of the stage as shown in FIG. 1, a description will be made of the direction (orientation) such as upward and downward.

With reference to FIG. 1, reference mark ST denotes that stage with an electrostatic chuck which is disposed inside a vacuum chamber (not illustrated) for performing various kinds of processing: such as film forming processing by a sputtering method, a plasma CVD, and the like; a heat treatment; an ion implantation processing; an etching processing; and the like. By the way, since a known art is utilized for the processing apparatus itself, a detailed description thereof will be omitted here.

The stage ST is constituted by a base 1 made of metal, and an electrostatic chuck EC which is disposed on an upper surface of the base 1 so as to hold the wafer W through attraction. The base 1 is constituted by an aluminum cylindrical body having a profile depending on the wafer W. The inside thereof is provided with a heating means 11 for heating the wafer W, and a cooling means (not illustrated) for cooling the wafer W by circulating a cooling medium so that, during processing, the wafer W can be heated or cooled. The electrostatic chuck EC is provided with a chuck plate 2 made of a dielectric, and a pair of electrodes 3a, 3b which are disposed inside the chuck plate 2 through an electrical insulation layer (not illustrated). A power supply apparatus Ps is disposed so as to apply DC voltage (chuck voltage) to both the electrodes 3a, 3b. As the chuck plate 2 there are utilized one made of PBN, made of ALN, or made of silicon rubber. Then, the base 1 and the chuck plate 2 of the electrostatic chuck EC have formed therein a plurality of through holes 4 in a manner to penetrate in the upward and downward direction. In this embodiment, on an imaginary circle passing through the center of the wafer W and a substantially radial intermediate point, three through holes 4 are provided in positions 120 degrees apart from one another in the circumferential direction. In this case, the radius of the imaginary circumference is appropriately determined considering the size of the wafer W. Then, each of the penetrating holes 4 has a lifting pin 5 respectively inserted thereinto as described hereinafter.

The power supply apparatus Ps is provided with a DC power supply unit E which applies DC voltage (chuck voltage) to the pair of electrodes 3a, 3b. In this case, provided that the circuit that applies DC voltage to the DC power supply unit E and both the electrodes 3a, 3b be defined as a first circuit C1, and that the circuit that connects both the electrodes 3a, 3b to the ground potential in order to charge-clearing the wafer W after processing be defined as a second circuit C2, there are provided two switching means 8a, 8b for switching between the first circuit C1 and the second circuit C2. Then, in the first circuit C1 as shown in FIG. 1, the positive (high-voltage side) output of the DC power supply unit E is connected to one 3b of the electrodes through one 8a of the switching means. The other 3a of the electrodes is connected to the negative (low-voltage side) output of the other DC power supply unit E. According to the above-mentioned arrangement, DC voltage is applied (chuck operation) across both the electrodes 3a, 3b in order to hold by attraction the wafer W by means of the chuck plate 2. On the one hand, in the second circuit C2 both the switching means 8a, 8b are switched, and the electrodes 3a, 3b are connected to the ground potential through the switching means 8a, 8b. According to the above-mentioned arrangement, after having performed a predetermined processing on the wafer W by utilizing plasma, the electrostatic charges remaining in the wafer W will be cleared (charge clearing operation). By the way, the operation of the DC power supply unit E and the switching means 8a, 8b is subject to an overall control by a control unit (not illustrated). Then, for the purpose of handing over the wafer W to this kind of stage ST, the substrate lifting apparatus LM of this embodiment is provided.

With reference also to FIG. 2(a) through FIG. 2(e), the lifting apparatus LM is provided with: lifting pins 5 respectively inserted through each of the through holes 4; and driving means 9 which moves upward and downward each of the lifting pins 5 relative to the stage ST. The driving means 9 is constituted by a so-called two-stage air cylinder. In this case, the air cylinder as the driving means 9 is provided with a cylinder main body 91, and an inside thereof is partitioned by a partition plate 92, having a central opening 92a, into an upper-side first chamber 93a and a lower-side second chamber 93b. The first chamber 93a contains therein, in a slidable manner, a first piston 94, and a rod 94a of the first piston 94 penetrates, in a slidable manner, through the central opening 92a formed in the partition plate 92 so as to protrude into the second chamber 93b. The second chamber 93b contains therein a second piston 95, in a slidable manner, and a rod 95a of the second piston 95 penetrates through a penetrating hole formed in the first piston 94 and through a penetrating hole formed in a wall surface of the cylinder main body 91, into an outside of the cylinder main body 91. An upper end of the second piston 95 protruded through and outside the cylinder main body 91 is provided with a driving plate 95b, and the driving plate 95b has connected thereto the lower end of respective lifting pins 5. A description will now be made in concrete, with reference also to FIG. 2(a) through FIG. 2(e), of the operation, by the air cylinder 9, of upward and downward movement of the lifting pins 5.

FIG. 2(a) shows the state in which each of the lifting pins 5 is in the hidden position. In the hidden position, compressed air is supplied from a first inlet port 96a and a second inlet port 96b of the cylinder main body 91. As a result, the first piston 94 comes into contact, inside the first chamber 93a, with the partition plate 92 and, also, the second piston 95 moves downward to a position in which the second piston 95 comes into contact with the bottom inner surface of the second chamber 93b. According to this arrangement, as a result of movement of the driving plate 95b to the lowermost position, each of the lifting pins 5 attains a state in which each of the lifting pins 5 has been completely lie hidden into the stage ST.

Then, the compressed air introduced into the second chamber 93b is discharged from a second outlet port 96e of the cylinder main body 91 and, at the same time, compressed air that is lower in pressure than the pressure of the compressed air inside the first chamber 93a, is introduced from a third inlet port 96c of the cylinder main body 91 into the second chamber 93b. Then, as a result of moving upward of the second piston 95 inside the second chamber 93b, the driving plate 95b is moved upward from the lowermost position so that the upper end surface of each of the lifting pins 5 first comes into contact with the rear surface of the wafer W (see contact position in FIG. 2(b)). When compressed air is further introduced, from this state, into the second chamber 93b, the second piston 95 further moves upward. But, since the pressure of the compressed air that has been introduced from the third inlet port 96c of the cylinder main body 91 into the second chamber 93b has been set lower than the pressure of the compressed air in the first chamber 93a, if the second piston 95 comes into contact with the lower end of the rod 94a that protrudes to the side of the second chamber 93b, the upward movement of the second piston 95 stops. According to this arrangement, the driving plate 95b moves upward, only by the distance corresponding to the stroke in which the second piston 95 comes, from the contact position, into contact with the lower end of rod 94a. As a result, the driving plate 95b moves upward so that the upper end of each of the lifting pins 5 protrudes beyond the stage and stops (see intermediate position shown in FIG. 2(c)).

Then, the compressed air that was introduced into the first chamber 93a of the cylinder main body 91 is discharged out of the first outlet port 96d of the cylinder main body 91 and, at the same time, compressed air is further introduced into the second chamber 93b from the third inlet port 96c of the cylinder main body 91. According to this arrangement, the pressure of the compressed air inside the second chamber 93b of the cylinder main body 91 will become higher than the pressure of the compressed air inside the first chamber 93a. The second piston 95 will therefore be moved upward to the position at which the second piston 95 comes into contact with the partition plate 92 inside the second chamber 93b. The driving plate 95b will thus move up to the uppermost position and, as a result, the upper part of each of the lifting pins 5 will be protruded upward beyond the stage ST (substrate hand over position as shown in FIG. 2(e)). A description will hereinbelow be made in concrete of a substrate transferring method using the substrate lifting apparatus LM as shown in FIG. 1 and FIG. 2.

In case a predetermined plasma processing is performed on the wafer W by a processing apparatus (not illustrated), first, the wafer W is placed on the surface of the electrostatic chuck EC in a state in which the switching has been made by the switching means 8a, 8b to the second circuit C2. In this case, by moving the lifting pins 5 upward to the substrate hand over position as shown in FIG. 2(e), the wafer W is handed over in this state by a transfer robot 10 so that the wafer W is handed over to the lifting pins 5. Then, the lifting pins 5 are moved downward to the hidden position as shown in FIG. 2(a), whereby the wafer W is placed in position on the upper surface of the chuck plate 2. Once the placement of the wafer W on the upper surface of the chuck plate 2 has been recognized, by switching to the first circuit C1 by the switching means 8a, 8b, DC voltage is applied to both the electrodes 3a, 3b. By means of the electrostatic force to be generated across both the electrodes 3a, 3b, the wafer W gets attracted and held (chucked) to the upper surface of the chuck plate 2.

Next, when the wafer W that has been processed is taken out, switching is made by the switching means 8a, 8b to the second circuit C2 so as to connect both the electrodes 3a, 3b to the ground potential. According to this arrangement, the wafer W that has been electrostatically charged as a result of going through the processing, e.g., by utilizing plasma, will be charge-cleared. But if each of the lifting pins 5 will have to be moved upward subject to the complete charge clearing, it takes time for the wafer W to be handed over, resulting in an decrease in throughput.

In this embodiment, after a lapse of a predetermined period of time from the time of having switched to the second circuit C2, the air cylinder 9 is driven to move the lifting pins 5 from the hidden position as shown in FIG. 2(a) upward so that the upper ends of the lifting pins 5 are brought into contact with the central part of the wafer W (see FIG. 2(b)). From this contact position the lifting pins 5 are further moved upward to about the intermediate position as shown in FIG. 2(c) and stop them, whereby the central part of the wafer W on the electrostatic chuck EC is locally lifted or caused to be floated (first step). According to this arrangement, that central part of the wafer W on which operates a pressing force from the lifting pins 5 is locally lifted or floated against the attraction force by the residual electric charge. The remaining part of the wafer W remains to be kept stuck or attracted to the chuck plate 2 (see FIG. 2 (c)). In this case, the height at which the part of the wafer W is locally lifted off from the upper surface of the chuck plate 2 to the highest lifted portion of the wafer W shall be above 1/500 and below 1/200.

Next, when the wafer W has been held for a predetermined period of time in the intermediate position as shown in FIG. 2(c) (second step), the remaining part of the wafer W comes to be gradually peeled off from the electrostatic chuck EC outward starting from that point of origin of the wafer W at which the pressing force from the lifting pins 5 operate due to the restoring force of the wafer W, finally ending in a state in which the wafer W has been completely peeled off as shown in FIG. 2(d). In this case, it is preferable to hold the wafer W in the intermediate position of the lifting pins 5, for above 4 seconds, at which the wafer W is kept locally lifted. Then, the lifting pins 5 are further moved upward from the intermediate position as shown in FIG. 2(c) to the substrate hand over position as shown in FIG. 2(e) (third step). The wafer W lifted to the substrate hand over position will be handed over from the lifting pins 5 to a robot arm 10a so as to be transferred by the transfer robot 10 from the processing chamber (see FIG. 2(e)).

According to the above-mentioned embodiment, unlike the case in which the wafer W is peeled off forcibly by causing a pressing force to operate from the lifting pins 5, there will be no problem of giving rise to positional deviation or rebounding of the wafer W. Therefore, without waiting for the complete charge clearing of the wafer W, the wafer that has been processed can be moved to the substrate hand over position without giving rise to the positional deviation or rebounding of the wafer W.

Next, in order to confirm the effect of this invention, the following experiments were carried out by using the substrate lifting apparatus LM as shown in FIG. 1. In this experiment, the to-be-processed substrate was a silicon wafer W of Φ200 mm (8 inches), the chuck plate 2 was made of PBN, and after having attracted the wafer W at a predetermined chuck voltage, processing using the plasma was tried to be carried out inside the vacuum chamber. Subsequently, after having stopped the voltage application to the electrostatic chuck EC, the lifting pins 5 were moved upward to the intermediate position and then held them there for a predetermined period of time. At this time, the height of the lifting pins 5 protruding from the upper surface of the chuck plate 2 in the intermediate position, and the holding time to hold the lifting pins 5 in the intermediate position were varied as in Table 1 (namely, by varying the height of the lifting pins 5 protruding from the upper surface of the chuck plate 2 by 0.1 mm within a range of 0.1 mm and 1.1 mm, and by varying the holding time to hold the lifting pins 5 in the intermediate position by 1 second within a range of 1 second and 10 seconds). In this manner, evaluation was made of the occurrence of positional deviation and bounding of the wafer W as well as the appropriateness (or suitability) of transferring of the wafer W due to the positional deviation and rebounding of the wafer W. The results of evaluation are shown in Table 1. By the way, the evaluation was made in the three-stage evaluation wherein: a case in which, due to the occurrence of the positional deviation and rebounding of the wafer W, the transfer of the wafer W was not able to be performed was defined as "x"; a case in which, although the rebounding of the wafer W did occur, the transfer of the wafer W was possible without the positional deviation of the wafer W was defined as "○"; and a case in which positional deviation and rebounding of the wafer W did not occur at all and was most appropriate to the transfer of the wafer W was defined as "⊚".

TABLE 1

| HOLDING TIME | HEIGHT OF LIFTING PINS PROTRUDING FROM UPPER SURFACE OF CHUCK PLATE | | | | | | | | | | |
|---|---|---|---|---|---|---|---|---|---|---|---|
| | 0.1 mm | 0.2 mm | 0.3 mm | 0.4 mm | 0.5 mm | 0.6 mm | 0.7 mm | 0.8 mm | 0.9 mm | 1.0 mm | 1.1 mm |
| 1 SECOND | X | X | X | ○ | ○ | ○ | ○ | ○ | ○ | ○ | X |
| 2 SECONDS | X | X | X | ○ | ○ | ○ | ○ | ○ | ○ | ○ | X |
| 3 SECONDS | X | X | ○ | ○ | ○ | ○ | ○ | ○ | ○ | ○ | X |
| 4 SECONDS | X | X | ○ | ◎ | ◎ | ○ | ○ | ○ | ○ | ○ | X |
| 5 SECONDS | X | X | ○ | ◎ | ◎ | ○ | ○ | ○ | ○ | ○ | X |
| 6 SECONDS | X | X | ○ | ◎ | ◎ | ○ | ○ | ○ | ○ | ○ | X |
| 7 SECONDS | X | X | ○ | ◎ | ◎ | ○ | ○ | ○ | ○ | ○ | X |
| 8 SECONDS | X | X | ○ | ◎ | ◎ | ○ | ○ | ○ | ○ | ○ | X |
| 9 SECONDS | X | X | ○ | ◎ | ◎ | ○ | ○ | ○ | ○ | ○ | X |
| 10 SECONDS | X | X | ○ | ◎ | ◎ | ○ | ○ | ○ | ○ | ○ | X |

From the Table 1 it has been confirmed that, if the height of the lifting pins 5 protruding from the upper surface of the electrostatic chuck EC (stage ST) is set to a range of 0.4 mm and 1.0 mm, the transferring can be performed without giving rise to the positional deviation of the wafer W, irrespective of the holding time in the intermediate position, even if the rebounding of the wafer W may have happened. Further, it has been confirmed that, if the height of the lifting pins 5 protruding from the upper surface of the electrostatic chuck EC is set to a range of 0.4 mm and 0.5 mm, and if the holding time to hold in the intermediate position is set to a range of 4 seconds and 10 seconds, the wafer W that has been processed can be moved to the substrate hand over position without giving rise to the positional deviation or rebounding of the wafer W, the above settings having been most appropriate for the transfer of the wafer W.

Next, with respect to each of the wafers W of different diameters (i.e., wafers W having wafer diameters of 150 mm, 200 mm, 300 mm, 450 mm), by having attracted the wafers W to the chuck plate 2 at a predetermined chuck voltage, processing was carried out inside the vacuum chamber by using plasma. Thereafter, by stopping the voltage application to the electrostatic chuck EC, the lifting pins 5 were moved upward to the intermediate position, and the lifting pins 5 were held in the intermediate position for 4 seconds. At this time, the height of the lifting pins 5 protruding from the upper surface of the chuck plate 2 in the intermediate position was varied by an increment of 0.1 mm each time. In this manner, the appropriateness of transfer of the wafer W due to the occurrence of positional deviation and rebounding of the wafer W was evaluated in three stages of "X", "○", and "◎" in the same manner as above. The range of height of the lifting pins 5 (lower limit and upper limit of height of the lifting pins 5) in which the evaluation of "○" and "◎" was obtained is shown in Table 2.

TABLE 2

| WAFER DIAMETER | RANGE OF HEIGHT OF LIFTING PINS IN INTERMEDIATE POSITION | |
|---|---|---|
| | ○ EVALUATION | ◎ EVALUATION |
| 150 mm | 0.3 mm~0.7 mm | 0.3 mm~0.4 mm |
| 200 mm | 0.4 mm~1.0 mm | 0.4 mm~0.5 mm |
| 300 mm | 0.5 mm~1.5 mm | 0.5 mm~0.7 mm |
| 450 mm | 0.8 mm~2.2 mm | 0.8 mm~1.1 mm |

From the Table 2 it has been confirmed that a generally proportional relationship can be obtained between the height of the lifting pins 5 protruding from the upper surface of the electrostatic chuck EC (stage ST) in the intermediate position and the diameter of the wafer W. Then, if the height of the lifting pins 5 protruding from the upper surface of the electrostatic chuck EC is set within a range of ⅟500 and ⅟200 of the wafer W diameter, the wafer W will be free from positional deviation, and the wafer W can be transferred. Further, it has been confirmed that, if the height of the lifting pins 5 protruding from the upper surface of the stage ST is set to a range of ⅟500 and ⅟400 of the diameter of the wafer W, the positional deviation of the wafer W or rebounding thereof will not occur, but that the wafer W that has been processed can be moved to the substrate hand over position, the above-mentioned range being the most appropriate to the transfer of the wafer W.

A description has so far been made of the embodiment of this invention, but this invention shall not be limited to the above, and may be appropriately modified within the range not departing from the technical idea of this invention. In the above-mentioned embodiment, description has been made of an example in which, as the driving means for moving the lifting pins 5 upward in a stepwise manner, a so-called two-stage type air cylinder 9 was used. However, a stepping motor may be used and the number of the lifting pins to be disposed or arranged need not be limited to the above, but may be appropriately set depending on the to-be-processed substrate.

In addition, in the above-mentioned embodiment, a description has been made of a bipolar type as the electrostatic chuck, but need not be limited to the above; a single-pole type will do as well. Still furthermore, in the above-mentioned embodiment, a description has been made of an example in which the to-be-processed substrate is selected to be a silicon wafer, but need not be limited to the above. This invention is also applicable to a rectangular glass substrate. In this case, e.g., in case the lifting pins are arranged circumferentially at a predetermined distance from one another, the number of the lifting pins or the diameter of the imaginary circumference may be appropriately set depending on the size.

EXPLANATION OF MARKS

LM substrate lifting apparatus
EC electrostatic chuck
ST stage
W wafer (to-be-processed substrate)
5 lifting pin
9 air cylinder (driving means)

The invention claimed is:

1. A substrate transferring method comprising: a stopping step of stopping the application of voltage to an electrostatic chuck, after having processed a to-be-processed substrate in a state of being attracted by applying voltage to electrodes of the electrostatic chuck disposed on an upper surface of a stage; and a lifting step of moving upward lifting pins, built in the stage so as to be movable upward and downward to a substrate hand over position by lifting the to-be-processed substrate to the substrate hand over position above the stage;
wherein the lifting step comprises:
a first step of moving upward the lifting pins from a hidden position lying hidden into the stage until the upper ends of the lifting pins are brought into contact with a central part of the to-be-processed substrate, the lifting pins being further moved upward from the position of the contact, thereby causing such a part of the to-be-processed substrate as is lying on the electrostatic chuck to be locally lifted;
a second step of holding, for a predetermined period of time, the lifting pins in an intermediate position in which the said part of the to-be-processed substrate is lifted; and
a third step of further moving upward the lifting pins from the intermediate position to the substrate hand over position,
wherein the to-be-processed substrate is a silicon wafer and
wherein, in the first step, the height of causing the said part of silicon wafer to be locally lifted from upper surface of the stage is set above $1/500$ and below $1/200$ of the substrate diameter.

2. The substrate transferring method according to claim 1, wherein the lifting pins are held for above 4 seconds in the intermediate position in which the said part of the to-be-processed substrate is lifted.

3. The substrate transferring method according to claim 2, wherein the lifting pins are held in a range of 4 seconds and 10 seconds.

4. The substrate transferring method according to claim 1, wherein the height is set above $1/500$ and below $1/400$ of the substrate diameter.

* * * * *